(12) United States Patent  
Kim et al.

(10) Patent No.: US 8,788,893 B2
(45) Date of Patent: Jul. 22, 2014

(54) SEMICONDUCTOR DEVICE AND MEMORY DEVICE

(75) Inventors: Kwanweon Kim, Gyeonggi-do (KR); Hyunsu Yoon, Gyeonggi-do (KR); Jeongtae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 143 days.

(21) Appl. No.: 13/596,975

(22) Filed: Aug. 28, 2012

(65) Prior Publication Data

US 2014/0068359 A1    Mar. 6, 2014

(51) Int. Cl.
*G11C 29/00* (2006.01)
*G11C 7/00* (2006.01)

(52) U.S. Cl.
USPC .......................................... 714/718; 365/201

(58) Field of Classification Search
CPC .... G11C 11/4063; G11C 29/48; G11C 29/44; G11C 29/50; G11C 29/56; H05K 999/99; G01R 31/31701; G01R 31/31926; G01R 31/318572
See application file for complete search history.

(56) References Cited

U.S. PATENT DOCUMENTS

| 6,667,902 | B2 | 12/2003 | Peng |
| 6,777,757 | B2 | 8/2004 | Peng et al. |
| 6,904,751 | B2 | 6/2005 | Makki et al. |
| 7,173,851 | B1 | 2/2007 | Callahan et al. |
| 7,269,047 | B1 | 9/2007 | Fong et al. |

*Primary Examiner* — Guerrier Merant
(74) *Attorney, Agent, or Firm* — IP & T Group LLP

(57) ABSTRACT

A memory device includes a command decoder for generating a test selection code and a test setup data by decoding an external command and an external address, a non-volatile memory for storing an internal setup data, a counter for generating an internal selection code by counting a clock, a first selector for selecting the test selection code during a test mode operation, selecting the internal selection code during a boot-up operation, and transferring the selected selection code through a selection code transfer bus, a second selector for selecting the test setup data during the test mode operation, selecting the internal setup data that is outputted from the non-volatile memory during the boot-up operation, and transferring the selected selection code through a setup data transfer bus; and setup circuits for performing a setup operation based on the information transferred through the selection code transfer bus and the setup data transfer bus.

8 Claims, 5 Drawing Sheets

SEMICONDUCTOR DEVICE AND MEMORY DEVICE

BACKGROUND

1. Field

Exemplary embodiments of the present invention relate to a semiconductor device, and more particularly, to a technology for transferring a setup data stored in the inside of a semiconductor device to various constituent elements of the semiconductor device.

2. Description of the Related Art

FIG. 1 illustrates the operations of setup circuits in a conventional memory device.

Referring to FIG. 1, the conventional memory device includes a command decoder 110, a plurality of fuse circuits 120_0 to 120_N, and a plurality of setup circuits 140_0 to 140_N.

The command decoder 110 generates instruction signals required to operate the memory device after decoding commands CMD and an address ADD that are inputted from the outside of the memory device. The instruction signals include a read command, a write command, an active command, a precharge command, and the like. Herein, the instruction signals are not shown in the drawing. The command decoder 110 also generates a test selection code TM_SEL<0:A> and a test setup data TM_DATA<0:B> based on the decoding result. The test selection code TM_SEL<0:A> is for deciding which one of the setup circuits 140_0 to 140_N is to be set up in the inside of the memory device. The test setup data TM_DATA<0:B> is used for the setup circuit selected based on the test selection code TM_SEL<0:A> to perform a setup operation.

The setup circuits 140_0 to 140_N include the fuse circuits 120_0 to 120_N, respectively, and store the setup data corresponding to the setup circuits, respectively. The fuse circuits 120_0 to 120_N are generally formed to include laser fuses that stores data according to whether the laser fuses are cut or not.

The setup circuits 140_0 to 140_N perform the corresponding setup operation. For example, the setup circuit 140_0 may be a circuit for setting up (or controlling) the level of a core voltage VCORE that is used in the inside of the memory device, and the setup circuit 140_1 may be a circuit for setting up a read operation timing in the inside of the memory device. The setup circuits 140_0 to 140_N may perform a setup operation based on setup data TM_DATA<0:B>. The setup operation is performed based on the setup data FUSE_DATA_0 to FUSE_DATA_N that are stored in the fuse circuits 120_0 to 120_N. (1) During a test mode, the test setup data TM_DATA<0:B> is transferred to a setup circuit that is selected based on the test selection code TM_SEL<0:A> among the setup circuits 140_0 to 140_N. The selected setup circuit performs its setup operation based on the test setup data TM_DATA<0:B>. (2) When the mode is not a test mode, the setup data FUSE_DATA_0 to FUSE_DATA_N that are stored in the fuse circuits 120_0 to 120_N are transferred to the setup circuits 140_0 to 140_N. The setup circuits 140_0 to 140_N performs a setup operation based on the setup data FUSE_DATA_0 to FUSE_DATA_N that are stored in the fuse circuits 120_0 to 120_N. Generally, the optimal setup value is detected by inputting various external test setup data TM_DATA<0:B> in a test mode. When the optimal setup value is detected, the optimal setup value is stored in the fuse circuits 120_0 to 120_N to be fixed.

The fuse circuits 120_0 to 120_N of FIG. 1 use laser fuses. A laser fuse stores a data of a logic high or low level according to whether the fuse is cut or not. A laser fuse may be programmed in the stage of wafer. The laser fuse cannot be programmed with a data once it is mounted on a package. To overcome the drawback, an e-fuse has been developed and used. An e-fuse is formed of a transistor and stores a data by changing the resistance between a gate and a source/drain.

FIG. 2 illustrates an e-fuse formed of a transistor operating as a resistor or a capacitor.

Referring to FIG. 2, the e-fuse includes a transistor T. When a power source voltage of a predetermined level where the transistor T may operate is applied to a gate G, the e-fuse operates as a capacitor C. Therefore, no current flows between the gate G and a drain D or a source S. However, when a voltage level, e.g., an over-voltage level where the transistor T cannot endure, is applied to the gate G, the gate oxide of the transistor T is destroyed to short the gate G and the drain/source D/S from each other. As a result, the e-fuse operates as a resistor R. Therefore, current may flow between the gate G and the drain/source D/S.

Based on this phenomenon, the data of the e-fuse is recognized from the resistance value between the gate G and the drain/source D/S of the e-fuse. The data of the e-fuse may be recognized by: (1) forming the transistor T in a big size, or (2) using an amplifier, instead of decreasing the size of the transistor T; and sensing the current flowing through the transistor T. When the transistor T has a big size, the data of the e-fuse may be recognized without performing a sensing operation. The above two methods, however, have limitation of dimensions because the transistor T functioning as the e-fuse is required to desirably have a big size, or to be couple to an additional amplifier for amplifying a data.

It is not easy to apply the e-fuse to the fuse circuits shown in FIG. 1 due to the limitation in dimensions. To overcome the concerns, U.S. Pat. Nos. 6,904,751, 6,777,757, 6,667,902, 7,173,851, and 7,269,047 disclose an e-fuse array and a method of using a data stored in the e-fuse array as a setup data used by a setup circuit. When the e-fuse is implemented in an array type, an amplifier may be shared, thereby decreasing the occupying area.

SUMMARY

An embodiment of the present invention is directed to a non-volatile memory device such as an e-fuse array disposed in the inside of a memory device, and a technology of transferring an initial setup data stored in the e-fuse array to setup circuits in the inside of the memory device.

Another embodiment of the present invention is directed to a scheme for transferring a setup data stored in the e-fuse array to setup circuits in the inside of the memory device.

In accordance with an embodiment of the present invention, a memory device includes a command decoder configured to generate a test selection code and a test setup data by decoding an external command and an external address; a non-volatile memory configured to store an internal setup data; a counter configured to generate an internal selection code by counting a clock; a first selector configured to select the test selection code during a test mode operation, select the internal selection code during a boot-up operation, and transfer the selected selection code through a selection code transfer bus; a second selector configured to select the test setup data during the test mode operation, select the internal setup data that is outputted from the non-volatile memory during the boot-up operation, and transfer the selected selection code through a setup data transfer bus; and a plurality of setup circuits configured to perform a setup operation based on the information transferred through the selection code transfer bus and the setup data transfer bus.

In accordance with another embodiment of the present invention, a semiconductor device includes a decoder configured to generate a test selection code and a test setup data by decoding an external input signal; a non-volatile memory configured to store an internal setup data; a counter configured to generate an internal selection code by counting a clock; a first selector configured to select the test selection code during a test mode operation, select the internal selection code during a boot-up operation, and transfer the selected selection code through a selection code transfer bus; a second selector configured to select the test setup data during the test mode operation, select the internal setup data that is outputted from the non-volatile memory during the boot-up operation, and transfer the selected selection code through a setup data transfer bus; and a plurality of setup circuits configured to perform a setup operation based on the information transferred through the selection code transfer bus and the setup data transfer bus.

DETAILED DESCRIPTION

Figure 1:
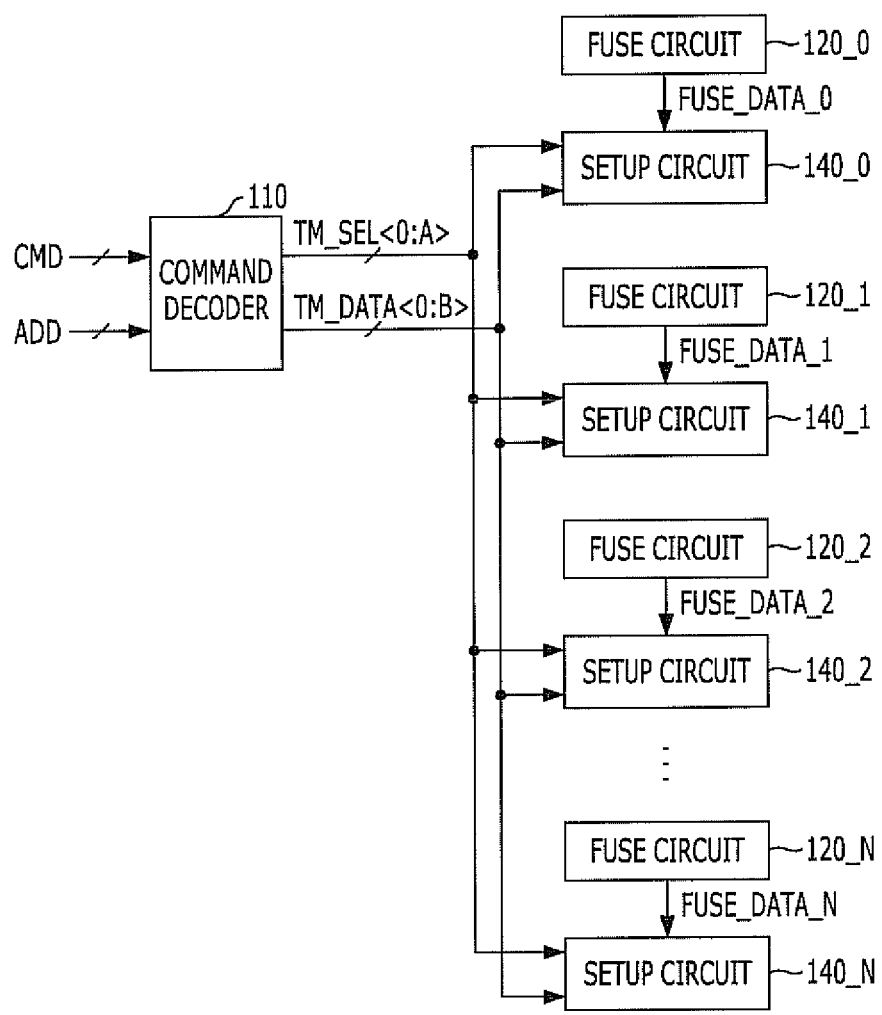
FIG. 1 illustrates the operations of setup circuits in a conventional memory device.
Figure 2:
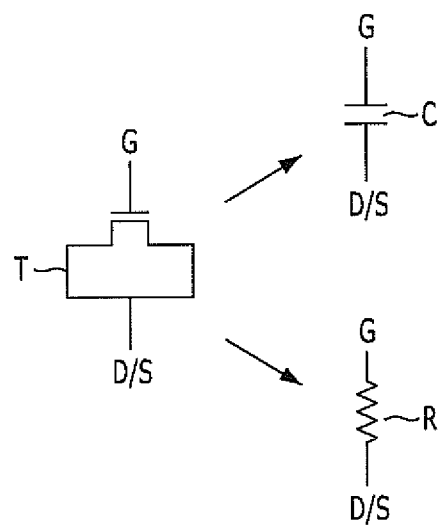
FIG. 2 illustrates an e-fuse formed of a transistor operating as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
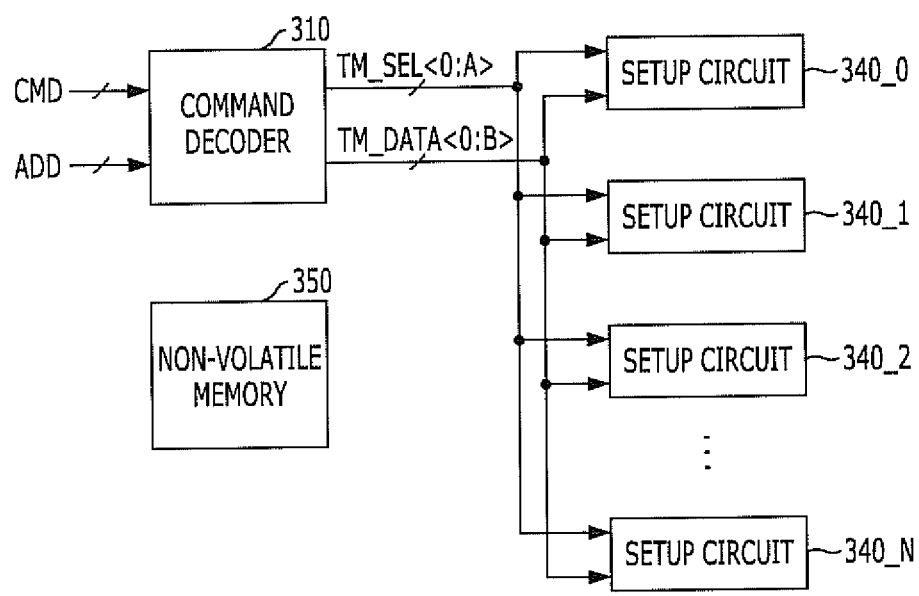
FIG. 3 illustrates a memory device with a non-volatile memory for storing setup information.

FIG. 3 illustrates a memory device with a non-volatile memory for storing setup information.

Referring to FIG. 3, the memory device includes a command decoder 310, a plurality of setup circuits 340_0 to 340_N, and a non-volatile memory 350.

The non-volatile memory 350 may substitute the fuse circuits 120_0 to 120_N of the conventional memory device. The non-volatile memory 350 stores the setup data corresponding to the setup circuits 340_0 to 340_N. The non-volatile memory 350 may be formed to include an e-fuse array, or it may be formed of a non-volatile memory device of diverse kinds, such as a flash memory device and Electrically Erasable Programmable Read-Only Memory (EEPROM) device.

The command decoder 310 generates instruction signals for operating the memory device after decoding a command CMD and an address ADD that are inputted from the outside of the memory device. Among the instruction signals are a read command, a write command, an active command, and a precharge command. The instruction signals are not shown in the drawing. The command decoder 310 also generates a test selection code TM_SEL<0:A> and a test setup data TM_DATA<0:B> after decoding the command CMD and the address ADD. The test selection code TM_SEL<0:A> is for deciding which setup circuits are enabled among the setup circuits 340_0 to 340_N in the inside of the memory device. The test setup data TM_DATA<0:B> is used by the setup circuit which is selected based on the test selection code TM_SEL<0:A> for performing a setup operation.

The setup circuits 340_0 to 340_N perform the setup operations respectively. For example, the setup circuit 340_0 may be a circuit for setting (or controlling) the level of a core voltage VCORE that is internally used in the memory device, and the setup circuit 340_1 may be a circuit for setting a read operation timing in the inside of the memory device. The setup circuits 340_0 to 340_N may perform a setup operation based on the test setup data TM_DATA<0:B> inputted from the outside of the memory device or may perform a setup operation based on the setup data stored in the non-volatile memory 350.

For the setup circuits 340_0 to 340_N to use the setup data stored in the non-volatile memory 350, the data have to be transferred from the non-volatile memory 350 to the setup circuits 340_0 to 340_N during the initialization period of the memory device, and the process is referred to as a boot-up. To transfer the setup data stored in the non-volatile memory 350 to the setup circuits 340_0 to 340_N, the setup circuit to store the outputted setup data has to be selected and the setup data has to be transferred to the selected setup circuit from the non-volatile memory 350. Hereafter, a scheme of the present invention that simplifies the data transfer is described.

Figure 4:
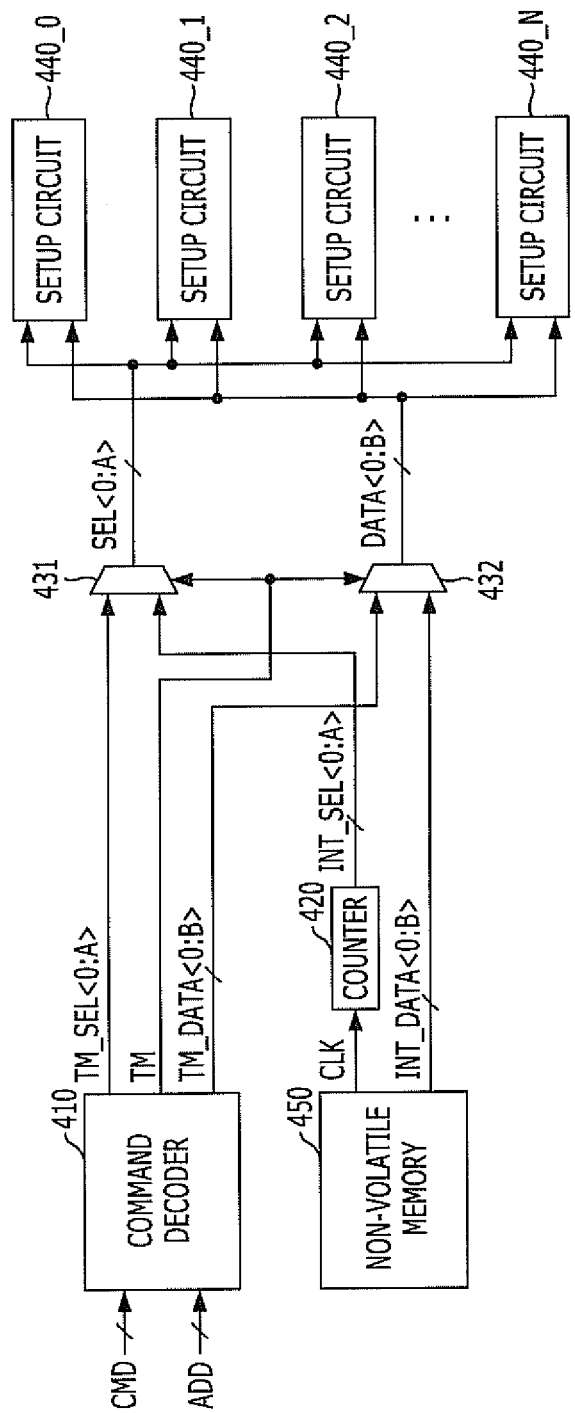
FIG. 4 illustrates a memory device in accordance with an embodiment of the present invention.

FIG. 4 illustrates a memory device in accordance with an embodiment of the present invention.

Referring to FIG. 4, the memory device includes a command decoder 410, a non-volatile memory 450, a counter 420, a first selector 431, a second selector 432, and a plurality of setup circuits 440_0 to 440_N. Further, there are a selection code transfer bus SEL<0:A>, a setup data transfer bus DATA<0:B>.

The non-volatile memory 450 substitutes the fuse circuits 120_0 to 120_N of the conventional memory device. The non-volatile memory 450 stores setup data corresponding to all of the setup circuits 440_0 to 440_N. The non-volatile memory 450 may be formed to include an e-fuse array or a non-volatile memory device of diverse kinds, such as a flash memory and an Electrically Erasable Programmable Read-Only Memory (EEPROM) device. A clock CLK is outputted from the non-volatile memory 450. The clock CLK is synchronized with an internal setup data INT_DATA<0:B> that is outputted from the non-volatile memory 450.

The command decoder 410 generates commands for operating the memory device after decoding a command CMD and an address ADD that are inputted from the outside of the memory device. Among the commands are a read command, a write command, an active command, and a precharge command. The commands are not shown in the drawing. The command decoder 410 also generates a test selection code TM_SEL<0:A> and a test setup data TM_DATA<0:B> by decoding the command CMD and the address ADD. The test selection code TM_SEL<0:A> is for selecting one or more one among the setup circuits 440_0 to 440_N in the inside of the memory device. The test setup data TM_DATA<0:B> is used by the selected to perform a setup operation. For example, the setup circuit 440_0 may setup the level of a core voltage VCORE that is internally used in the memory device, and the setup circuit 440_1 may setup a read operation timing. And the setup circuit 440_2 may setup a write operation timing. A test mode signal TM outputted from the command decoder 410 is enabled in the test mode. In the test mode, the setup circuits 440_0 to 440_N performs setup operation based on the command CMD and the address ADD that are inputted from the outside of the memory device.

The counter 420 generates an internal selection code INT_SEL<0:A> by counting the clock CLK that is transferred from the non-volatile memory 450. Whenever the clock CLK toggles, the value of the internal selection code INT_SEL<0:A> is changed.

The first selector 431 transfers a test selection code TM_SEL<0:A> through the selection code transfer bus SEL<0:A> during a test mode operation. The first selector 431 transfers the internal selection code INT_SEL<0:A> through the selection code transfer bus SEL<0:A> during a boot-up operation. In other words, when the test mode signal TM is enabled, the test selection code TM_SEL<0:A> is transferred through the selection code transfer bus SEL<0:A>, and otherwise, the internal selection code INT_SEL<0:A> is transferred through the selection code transfer bus SEL<0:A>.

The second selector 432 transfers the test setup data TM_DATA<0:B> through the setup data transfer bus DATA<0:B> during a test mode operation. The second selector 432 transfers the internal setup data INT_DATA<0:B> through the setup data transfer bus DATA<0:B> during a boot-up operation. These operations may be performed using the test mode signal TM.

The setup circuits 440_0 to 440_N perform a setup operation based on the information that is transferred through the selection code transfer bus SEL<0:A> and the setup data transfer bus DATA<0:B>. One among the setup circuits 440_0 to 440_N is selected based on the selection code that is transferred through the selection code transfer bus SEL<0:A>. The selected setup circuit performs a setup operation based on the setup data transferred to the setup data transfer bus DATA<0:B>.

Referring to FIG. 4, the test setup data TM_DATA<0:B> generated by the command decoder 410 based on the command CMD and the address ADD that are inputted from the outside of the memory device and the internal setup data INT_DATA<0:B> that is stored in the non-volatile memory 450 are transferred to the setup circuits 440_0 to 440_N through the same setup data transfer bus DATA<0:B>. Also, the test selection code TM_SEL<0:A>, which is generated by the command decoder 410 based on the command CMD, and the address ADD and the internal selection code INT_SEL<0:A>, which is generated by the counter 420, are transferred to the setup circuits 440_0 to 440_N through the same selection code transfer bus SEL<0:A>. Therefore, the information stored in the non-volatile memory 450 may be transferred to the setup circuits 440_0 to 440_N without additional lines. In particular, since the setup circuits 440_0 to 440_N are usually disposed to be scattered in different parts of the memory device, additional lines are less required so that the area of the memory device may be reduced. Also, since a simple scheme of generating the internal selection code INT_SEL<0:A> by counting the clock CLK in order to select a setup circuit where the internal setup data INT_DATA<0:B> in the non-volatile memory 450 is to be stored, the increased area of the memory device is minimized.

Figure 5:
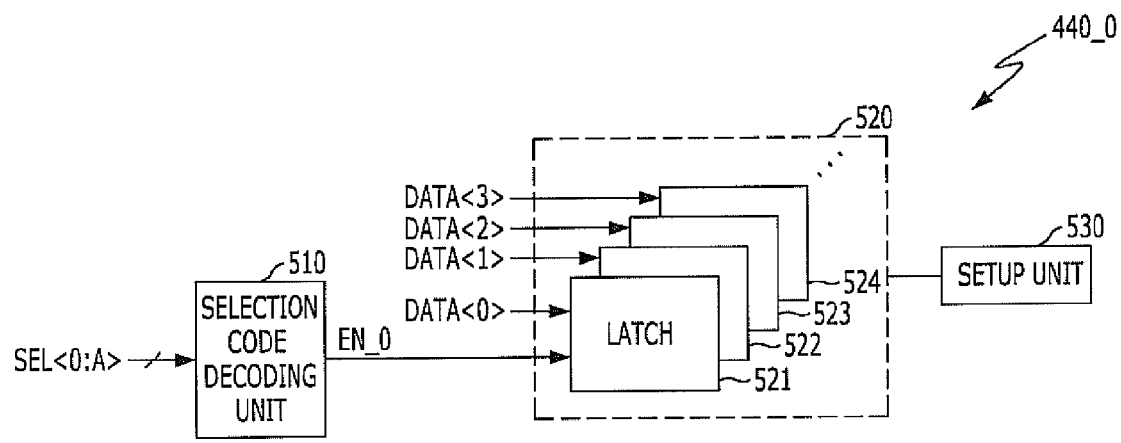
FIG. 5 illustrates a setup circuit shown in FIG. 4.

FIG. 5 illustrates the setup circuit 440_0 shown in FIG. 4.

Referring to FIG. 5, the setup circuit 440_0 includes a selection code decoding unit 510, a latch unit 520, and a setup unit 530.

The selection code decoding unit 510 generates an enable signal EN_0 after decoding the selection code transferred through the selection code transfer bus SEL<0:A>. The selection code decoding unit 510 enables the enable signal EN_0 only when the selection code on the bus SEL<0:A> has a particular combination. The combination of the selection code on the bus SEL<0:A> that enables the enable signal EN_0 is different for each setup circuit 440_0 to 440_N. To taken an example, when A is assumed to be 3, in the setup circuit 440_0, the enable signal EN_0 is enabled when a selection code on the bus SEL<0:3> is '0001'. In the setup circuit 440_1, an enable signal EN_1 may be enabled when the selection code on the bus SEL<0:3> is '0010'. In the setup circuit 440_2, an enable signal EN_2 may be enabled when the selection code on the bus SEL<0:3> is '0011'.

The latch unit 520 stores a data loaded on the setup data transfer bus DATA<0:B> when the enable signal EN_0 is enabled. The latch unit 520 includes as many latches 521 to 524 as the number of the bits (B+1) of the setup data transfer bus DATA<0:B>.

The setup unit 530 performs a setup operation based on the setup data stored in the latch unit 520. The setup unit 530 may be a circuit for setting up the level of voltage that is internally used in the memory device, such as core voltage VCORE, setting up the timing for a read operation or a write operation, or setting up diverse latency values.

While the present invention has been described with respect to the specific embodiments, it will be apparent to those skilled in the art that various changes and modifications may be made without departing from the spirit and scope of the invention as defined in the following claims.

Although the present invention is described by taking a memory device as an example, it is obvious to those skilled in the art that the scheme of the present invention is applied not only to the memory device but also general semiconductor devices. This is because diverse setups are made based on an external input in the general semiconductor devices or based on the information stored in the inside of the general semiconductor devices. When the technology of the present invention is applied to a semiconductor device, a decoder for generating a test selection code and a test setup data by decoding an external input signal is needed, instead of the command decoder for generating a test selection code and a test setup data by receiving an address and a command.

What is claimed is:

1. A memory device, comprising: a command decoder configured to generate a test selection code and a test setup data by decoding an external command and an external address; a non-volatile memory configured to store an internal setup data; a counter configured to generate an internal selection code by counting a clock; a first selector configured to select the test selection code during a test mode operation, select the internal selection code during a boot-up operation, and transfer the selected selection code through a selection code transfer bus; a second selector configured to select the test setup data during the test mode operation, select the internal setup data that is outputted from the non-volatile memory during the boot-up operation, and transfer the selected setup data through the setup data transfer bus; and a plurality of setup circuits configured to perform a setup operation based on the information transferred through the selection code transfer bus and the setup data transfer bus.

2. The memory device of claim 1, wherein the clock is synchronized with the internal setup data that is outputted from the non-volatile memory.

3. The memory device of claim 1, wherein a setup circuit selected based on the selection code that is transferred through the selection code transfer bus among the multiple setup circuits receives a setup data that is transferred through the setup data transfer bus.

4. The memory device of claim 1, wherein each of the setup circuits includes:
- a selection code decoding unit for generating an enable signal by decoding a selection code that is transferred through the selection code transfer bus;
- a latch unit for storing a setup data that is transferred through the setup data transfer bus when the signal is enabled; and
- a setup unit for performing a setup operation based on the setup data stored in the latch unit.

5. The memory device of claim 1, wherein each of the selection code transfer bus and the setup data transfer bus includes a plurality of lines.

6. The memory device of claim 1, wherein the non-volatile memory include an e-fuse array.

7. A semiconductor device, comprising: a decoder configured to generate a test selection code and a test setup data by decoding an external input signal; a non-volatile memory configured to store an internal setup data; a counter configured to generate an internal selection code by counting a clock; a first selector configured to select the test selection code during a test mode operation, select the internal selection code during a boot-up operation, and transfer the selected selection code through a selection code transfer bus; a second selector configured to select the test setup data during the test mode operation, select the internal setup data that is outputted from the non-volatile memory during the boot-up operation, and transfer the selected setup data through the setup data transfer bus; and a plurality of setup circuits configured to perform a setup operation based on the information transferred through the selection code transfer bus and the setup data transfer bus.

8. The semiconductor device of claim 7, wherein the clock is synchronized with the internal setup data that is outputted from the non-volatile memory.

* * * * *